United States Patent
Won et al.

(10) Patent No.: US 7,200,044 B2
(45) Date of Patent: Apr. 3, 2007

(54) PAGE BUFFER CIRCUIT WITH REDUCED SIZE, AND FLASH MEMORY DEVICE HAVING PAGE BUFFER AND PROGRAM OPERATION METHOD THEREOF

(75) Inventors: Sam Kyu Won, Kyeongki-do (KR); Jin Yong Seong, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/164,612

(22) Filed: Nov. 30, 2005

(65) Prior Publication Data

US 2007/0002623 A1    Jan. 4, 2007

(30) Foreign Application Priority Data

May 25, 2005    (KR) .................. 10-2005-0044196

(51) Int. Cl.
G11C 16/06    (2006.01)
G11C 16/04    (2006.01)
G11C 7/10    (2006.01)

(52) U.S. Cl. ..................... 365/185.22; 365/185.03; 365/185.28; 365/185.33; 365/189.05

(58) Field of Classification Search ............ 365/185.22
See application file for complete search history.

(56) References Cited

U.S. PATENT DOCUMENTS

| 5,521,865 | A  | * | 5/1996  | Ohuchi et al. | ......... | 365/185.22 |
| 5,570,315 | A  | * | 10/1996 | Tanaka et al. | ......... | 365/185.22 |
| 5,986,929 | A  | * | 11/1999 | Sugiura et al. | ........ | 365/185.03 |
| 6,545,909 | B2 | * | 4/2003  | Tanaka et al. | ......... | 365/185.03 |
| 6,671,204 | B2 | * | 12/2003 | Im            | ......... | 365/185.12 |
| 6,937,510 | B2 | * | 8/2005  | Hosono et al. | ........ | 365/185.03 |
| 6,963,509 | B1 | * | 11/2005 | Ju            | ......... | 365/189.05 |
| 6,996,014 | B2 | * | 2/2006  | Lee et al.    | ............. | 365/189.05 |
| 7,006,380 | B2 | * | 2/2006  | Toda          | .................. | 365/185.21 |
| 7,009,878 | B2 | * | 3/2006  | Hosono et al. | ........ | 365/185.03 |
| 7,042,770 | B2 | * | 5/2006  | Lee et al.    | ............. | 365/189.05 |
| 2005/0213378 | A1 | * | 9/2005 | Chang    | ................ | 365/185.03 |
| 2006/0018152 | A1 | * | 1/2006 | Kawai    | ................ | 365/185.03 |

* cited by examiner

*Primary Examiner*—Son L. Mai
(74) *Attorney, Agent, or Firm*—Marshall, Gerstein & Borun LLP

(57) ABSTRACT

The present invention relates to a page buffer circuit with a reduced size, and a flash memory device having the page buffer circuit and program operation method thereof. According to the present invention, a page buffer circuit can perform a program operation of a Multi-Level Cell (MLC) using a data verify circuit even without a data compare circuit. Accordingly, an occupation area can be reduced and the size of a flash memory device can also be reduced.

27 Claims, 11 Drawing Sheets

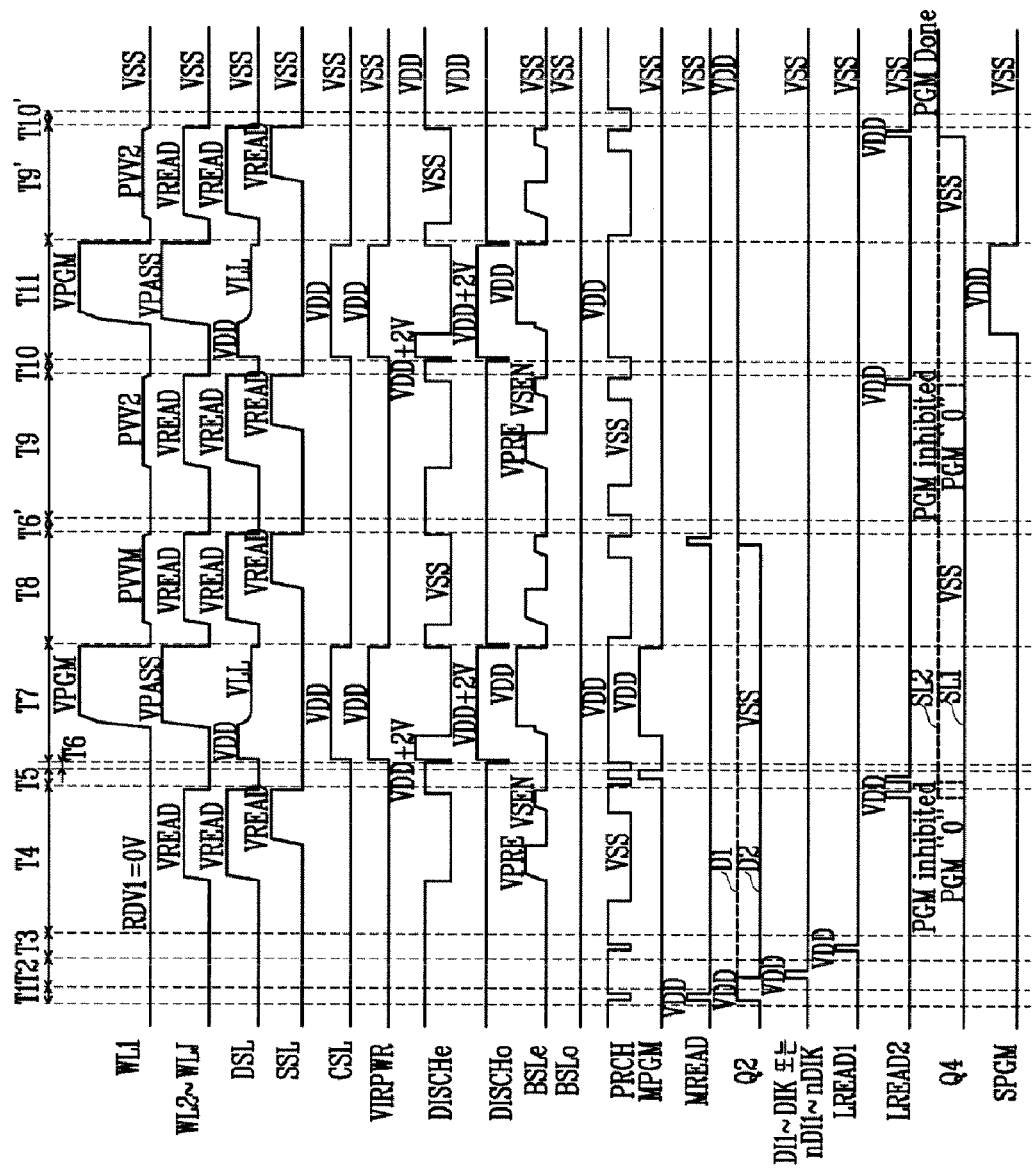

PAGE BUFFER CIRCUIT WITH REDUCED SIZE, AND FLASH MEMORY DEVICE HAVING PAGE BUFFER AND PROGRAM OPERATION METHOD THEREOF

FIELD OF THE INVENTION

The present invention relates to semiconductor memory devices, and more specifically, to flash memory devices.

DISCUSSION OF RELATED ART

Generally, a flash memory device includes a page buffer for programming or reading a large quantity of data for a short period of time. Therefore, the program operation or read operation of the flash memory device is executed by the page buffer on a page basis. Recently, in order to further improve the degree of integration of flash memory devices, flash memory devices having a Multi-Level Cell (MLC) capable of storing plural bits of data have been developed. In general, 2-bit data can be programmed into the MLC. Thus, one MLC can store any one of four data, i.e., [11], [10], [00] and [01]. Furthermore, the MLC has a threshold voltage (one of Vt1 to Vt4) corresponding to the stored data (one of [11], [10], [00] and [01]). In contrast, a memory cell capable of storing data of a single bit is generally referred to as a Single Level Cell (SLC).

FIG. 1 is a schematic block diagram of a page buffer circuit of a conventional flash memory device. There is shown in FIG. 1 the page buffer circuit for the program operation and the read operation of the MLC. Referring to FIG. 1, the page buffer circuit 10 includes a bit line select circuit 11, a precharge circuit 12, an upper-bit register circuit 13, a lower-bit register circuit 1 4, a data compare circuit 15, an upper data transmission circuit 16 and a lower data transmission circuit 17. A process in which the page buffer circuit 10 programs lower-bit data into a MLC (not shown) will be described below shortly.

The upper-bit register 13 and the lower-bit register 14 are first initialized. Data to be programmed are stored in the upper-bit register 13. Thereafter, the data stored in the upper-bit register 13 are transmitted to the lower-bit register 14 and then stored in the lower-bit register 14. The lower data transmission circuit 17 outputs the data stored in the lower-bit register 14 to a sensing node (SN). As a result, the data stored in the lower-bit register 14 are transferred to bit lines BLe or BLo, which are connected to the sensing node SN through the bit line select circuit 11, and are then programmed into the MLC connected to the bit lines BLe or BLo. The program operation of the lower-bit data into the MLC is thus completed through the above-described process. Furthermore, a process of programming upper-bit data into the MLC will be described below.

The upper-bit register 13 and the lower-bit register 14 are first initialized. Data to be programmed are stored in the upper-bit register 13. In the lower-bit register 14 are stored lower-bit data read from the MLC. Thereafter, the data stored in the upper-bit register 13 are transmitted to the lower-bit register 14 and then stored in the lower-bit register 14. The data compare circuit 15 compares the data stored in the upper-bit register 13 and the data stored in lower-bit register 14, and outputs the data stored in the upper-bit register 13 or the lower-bit register 14 to the sensing node SN according to the comparison result. As a result, the data output from the data compare circuit 15 are transferred to the bit lines BLe or BLo connected to the sensing node SN through the bit line select circuit 11 and then programmed into the MLC connected to the bit lines BLe or BLo. The program operation of the upper-bit data into the MLC is thus completed through the aforementioned process.

As described above, the page buffer circuit 10 must have the data compare circuit 15 in order to program upper-bit data after programming lower-bit data into the MLC. Accordingly, there are problems in that an occupation area is reduced and the size of a semiconductor memory device is increased.

SUMMARY OF THE INVENTION

An advantage of the present invention is a page buffer circuit which can reduce an occupation area by executing a program operation of a MLC using a data verify circuit, even without having a data compare circuit.

Another advantage of the present invention is a flash memory device having a page buffer circuit which can reduce an occupation area by executing the program operation of a MLC using a data verify circuit, even without having a data compare circuit.

Further another advantage of the present invention is a program operation method of a flash memory device, wherein the size of the flash memory device can be reduced by executing the program operation of a MLC using a data verify circuit even without having a data compare circuit.

According to an aspect of the present invention, there is provided a page buffer circuit of a flash memory device having a plurality of MLCs connected to at least one pair of bit lines, including an upper-bit register, a lower-bit register, an upper bit verify circuit and a lower bit verify circuit. The upper-bit register senses a voltage of a sensing node and stores upper sensing data and outputs inversed upper sensing data, or stores input data and outputs inversed input data, in response to a first read control signal. The lower-bit register senses a voltage of the sensing node, stores first lower sensing data and outputs inversed first lower sensing data, in response to a second read control signal, or senses a voltage of the sensing node, stores second lower sensing data and outputs inversed second lower sensing data, in response to a third read control signal. The upper bit verify circuit receives one of the inversed upper sensing data and the inversed input data, and outputs upper verify data in response to the received data. The lower bit verify circuit receives first lower sensing data or inversed second lower sensing data, and outputs lower verify data in response to the received data.

According to another aspect of the present invention, there is provided a flash memory device having a memory cell array, a plurality of page buffer circuits, a plurality of Y-gate circuits and a verify data decision unit. The memory cell array includes a plurality of MLCs respectively connected to a plurality of pairs of bit lines and a plurality of word lines. The plurality of page buffer circuits are disposed corresponding to the plurality of pairs of bit lines, respectively. Each of the plurality of page buffer circuits outputs data, which will be programmed, to one of the MLCs connected to a corresponding pair of bit lines and generates upper verify data and lower verify data, at the time of a program operation. Furthermore, each of the plurality of page buffer circuits stores data read from one of the MLCs connected to the pair of bit lines at the time of a read operation. A plurality of Y-gate circuits is connected to the plurality of page buffer circuits, respectively, and a data I/O line. Each of the plurality of Y-gate circuits outputs data to be programmed, which are received through the data I/O line, to a corresponding page buffer circuit in response to one of I/O control signals at the time of the program operation. Furthermore, each of the plurality of Y-gate circuits outputs data, which are received from the corresponding page buffer circuit, to the data I/O line at the time of the read operation. A verify data decision unit determines logical values of the upper verify data respectively received from the plurality of page buffer circuits through the first data verify lines, and output a first verify signal according to the determination result. Furthermore, the verify data decision unit determines logical values of the lower verify data respectively received from the plurality of page buffer circuits through the second data verify lines, and output a second verify signal according to the determination result.

According to further another aspect of the present invention, there is provided a program operation method of a flash memory device having a plurality of MLCs respectively connected to a plurality of pairs of bit lines and a plurality of word lines, including the steps of allowing a X-decoder to decode a row address signal according to a program command, and activating one of the plurality of word lines according to the decoding result, allowing a Y-decoder to decode a column address signal according to a program command, and generating page buffer control signals according to the decoding result, allowing a plurality of page buffers, which are connected to the plurality of pairs of bit lines, respectively, and sensing nodes, to select one of the pair of corresponding bit lines according to the page buffer control signals, respectively, storing lower program data in each of the plurality of page buffers according to each of the page buffer control signals, allowing each of the plurality of page buffers to verify lower-bit data read from a MLC to be programmed, which is connected to the selected bit line and the activated word line, and programming or not programming the lower program data into the MLC to be programmed according to the verification result, storing upper program data in each of the plurality of page buffers in response to each of the page buffer control signals, and allowing each of the plurality of page buffers to verify the upper program data, and programming or not programming the upper program data in the MLC to be programmed according to the verification result.

BRIEF DESCRIPTION OF THE DRAWINGS

FIG. 11 is a timing diagram of signals related to the processing processes (S360, S370) shown in FIGS. 9 and 10.

DETAILED DESCRIPTION OF PREFERRED EMBODIMENTS

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
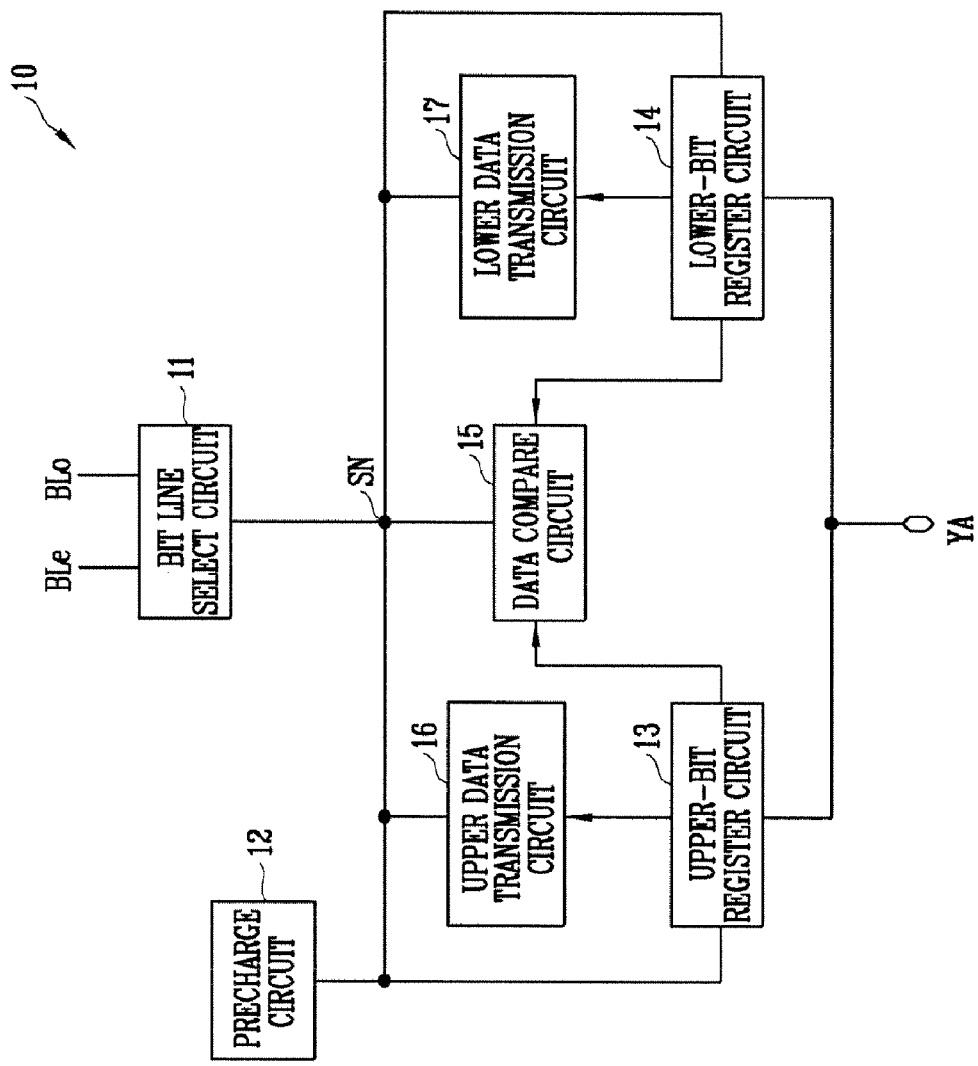
FIG. 1 is a schematic block diagram of a page buffer circuit of a conventional flash memory device.
Figure 2:
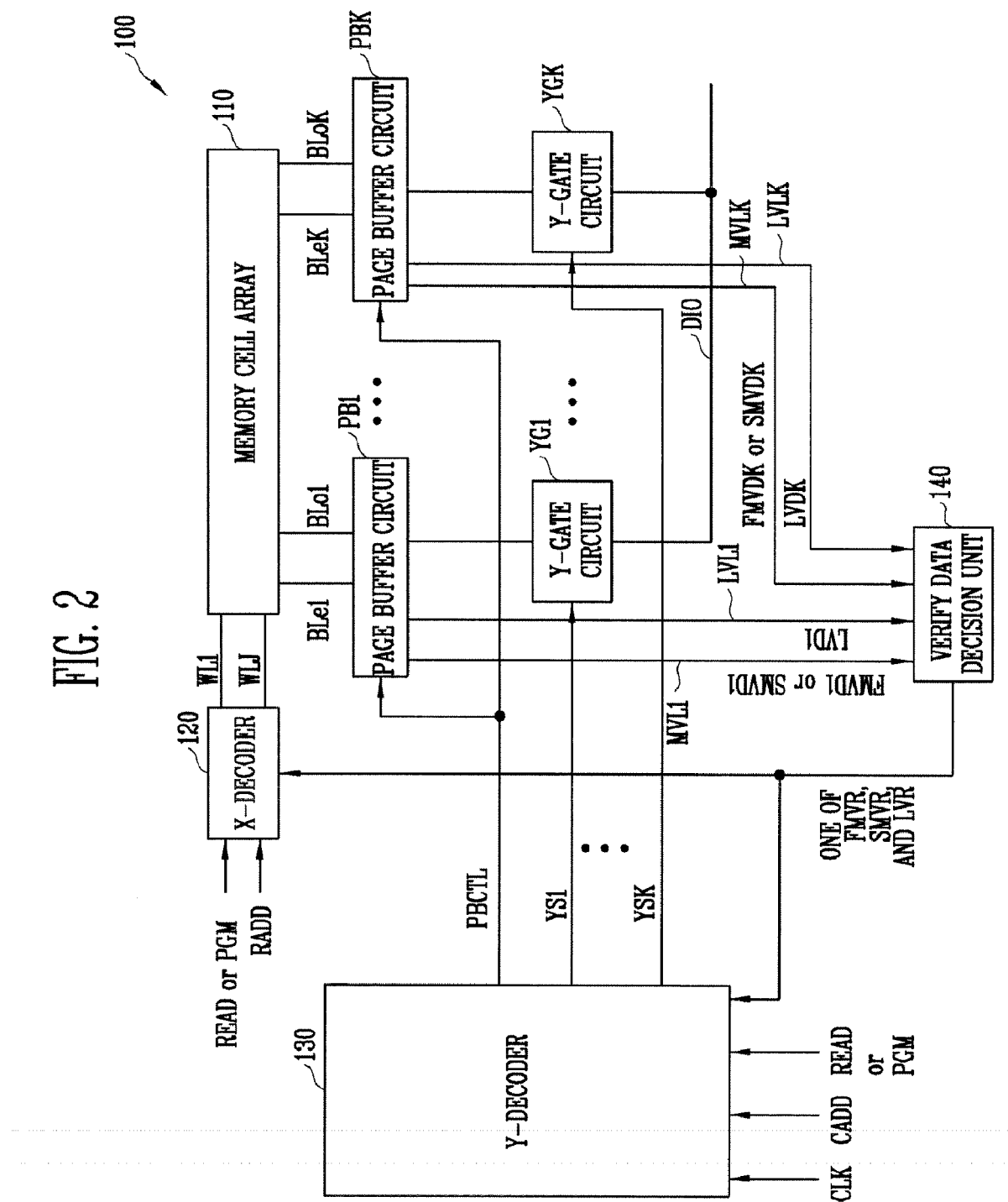
FIG. 2 is a schematic block diagram of a flash memory device having page buffer circuits according to an embodiment of the present invention.

FIG. 2 is a schematic block diagram of a flash memory device having page buffer circuits according to an embodiment of the present invention.

Referring to FIG. 2, the flash memory device 100 includes a memory cell array 110, a plurality of page buffer circuits PB1 to PBK (K is an integer), a plurality of Y-gate circuits YG1 to YGK, a X-decoder 120, a Y-decoder 130 and a verify data decision unit 140. The memory cell array 110 includes a plurality of MLCs (not shown) that share bit lines BLe1 to BLeK, BLo1 to BLoK (K is an integer) and word lines WL1 to WLJ a is an integer). A pair of bit lines is connected to each of the plurality of page buffer circuits PB1 to PBK. For example, to the page buffer circuit PB1 is connected the bit lines BLe1, BLo1. Each of the plurality of page buffer circuits PB1 to PBK outputs data (not shown) to be programmed to one of MLCs, which are connected to the pair of bit lines connected thereto, in a program operation of the flash memory device 100. Further, each of the plurality of page buffer circuits PB1 to PBK stores data (not shown) read from one of MLCs, which is connected to the pair of bit lines connected thereto, in the read operation of the flash memory device 100. The Y-gate circuits YG1 to YGK are connected to the plurality of page buffer circuits PB1 to PBK, respectively, and are also connected to a data I/O line DIO. The Y-gate circuits YG1 to YGK output data to be programmed, which are received through the data I/O line DIO, to the page buffer circuits PB1 to PBK in response to I/O control signals YS1 to YSK in the program operation of the flash memory device 100. Furthermore, in the read operation of the flash memory device 100, the Y-gate circuits YG1 to YGK output read data, which are received from corresponding page buffer circuits, to the data I/O line DIO.

The X-decoder 120 decodes a row address signal (RADD) in response to a program command (PGM) or read command (READ), and activates one of the word lines WL1 to WLJ according to the decoding result. Furthermore, the X-decoder 120 receives one of verify signals (FMVR, SMVR and LVR), and applies or do not apply a program voltage to the activated word line in response to the received verify signals (one of FMVR, SMVR and LVR). To be more specific, when the received verify signal (one of FMVR, SMVR and LVR) is enabled, the X-decoder 120 applies the program voltage to the activated word line.

The Y-decoder 130 decodes a column address signal (CADD) in response to a program command (PGM) or a read command (READ), and outputs a page buffer control signal (PBCTL) according to the decoding result. The page buffer control signal (PBCTL) outputs discharge signals (DISCHe, DISCHo), bit line select signals (BSLe, BSLo), a precharge control signal (PRCH), program control signals (MPGM, SPGM), read control signals (MREAD, LREAD1, LREAD2), data input signals (DI1 to DIK, nDI1 to nDIK) (K is an integer), and data output signals (MBDO, SBDO).

Furthermore, the Y-decoder 130 outputs the I/O control signals (YS1 to YSK) according to the decoding result.

The verify data decision unit 140 determines logical values of first or second upper verify data (FMVD1 to FMVDK or SMVD1 to SMVDK) (K is an integer), which are received from the plurality of page buffer circuits PB1 to PBK through the first data verify lines MVL1 to MVLK (K is an integer), and outputs a verify signal (FMVR or SMVR) according to the determination result. To be more specific, when some of or all the first or second upper verify data (FMVD1 to FMVDK or SMVD1 to SMVDK) (K is an integer) is a logical "1", the verify data decision unit 140 enables the verify signal (FMVR or SMVR). Furthermore, the verify data decision unit 140 determines logical values of lower verify data (LVD1 to LVDK) (K is an integer), which are receive from the plurality of page buffer circuits PB1 to PBK through the second data verify lines LVL1 to LVLK (K is an integer), and outputs a verify signal (LVR) according to the determination result. To be more specific, some or all of the lower verify data (LVD1 to LVDK) is a logical "1", the verify data decision unit 140 enables the verify signal (LVR).

Figure 3:
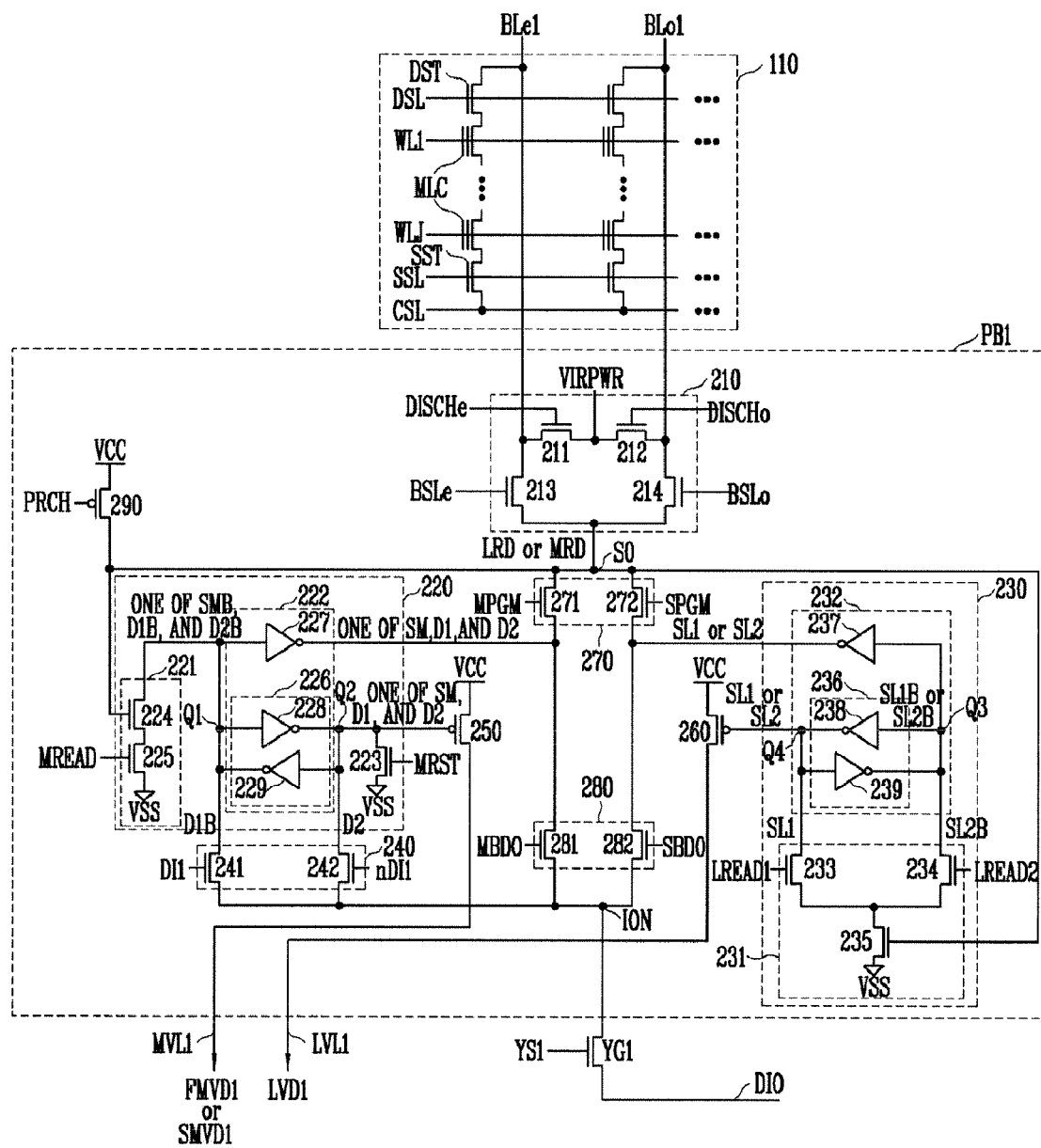
FIG. 3 shows a detailed circuit diagram of the page buffer circuit shown in FIG. 2.

The construction and operation of the page buffer circuits PB1 to PBK will be described in detail below with reference to FIG. 3. The page buffer circuits PB1 to PBK have the same construction and operation. Thus, only the page buffer circuit PB1 will be described. Meanwhile, FIG. 3 shows a portion of the memory cell array 110 connected to the page buffer circuit PB1 through the bit lines BLe1, BLo1. The memory cell array 110 includes MLCs, drain select transistors DST and source select transistors SST. Gates of the MLCs are connected to the word lines WL1 to WLJ, respectively. Furthermore, a predetermined number of MLCs is serially connected between each of the drain select transistors DST and each of the source select transistors SST. Further, the drain select transistors DST are connected to the bit lines BLe1, BLo1, respectively.

The page buffer circuit PB1 includes a bit line select circuit 210, an upper-bit register 220, a lower-bit register 230, a data input circuit 240, an upper bit verify circuit 250, a lower bit verify circuit 260, a data transmission circuit 270, a data output circuit 280 and a precharge circuit 290. The bit line select circuit 210 selects one of the bit lines BLe1, BLo1 according to bit line select signals (BSLe, BSLo) and discharge signals (DISCHe, DISCHo), and connects the selected bit line BLe1 or BLo1 to a sensing node SO. The bit line select circuit 210 includes NMOS transistors 211 to 214. A detailed operation of the bit line select circuit 210 is well known to those skilled in the art. Description thereof will be thus omitted.

The upper-bit register 220 includes a sensing circuit 221, a latch circuit 222 and a latch reset circuit 223. The sensing circuit 221 has NMOS transistors 224, 225. It senses a voltage of the sensing node SO in response to a read control signal (MREAD) and outputs upper sensing data (SMB) to a node Q1. The latch circuit 222 includes a latch 226 and an inverter 227. The latch 226 latches the upper sensing data (SMB) of the node Q1, and outputs inversed upper sensing data (SM) to a node Q2. Furthermore, the latch 226 latches input data (D1B or D2B) and outputs inversed input data (D1 or D2B) to the node Q2 or Q1. The inverter 227 receives the upper sensing data (SMB) or the input data (D1B or D2B) from the latch 226 through the node Q1, inverts the received data (one of SMB, D1B and D2B), and outputs the inverted data. The latch reset circuit 223 initializes the latch circuit 222 in response to a reset control signal (MRST).

The lower-bit register 230 includes a sensing circuit 231 and a latch circuit 232. The sensing circuit 231 has NMOS transistors 233 to 235, and it senses a voltage of the sensing node SO in response to a read control signal (LREAD1 or LREAD2) and outputs lower sensing data (SL1 or SL2B) to a node Q4 or Q3. The latch circuit 232 has a latch 236 and an inverter 237. The latch 236 latches lower sensing data (SL1 or SL2B), and outputs inversed lower sensing data (SL1B or SL2) to the node Q3 or Q4. The inverter 237 receives the inversed lower sensing data (SL1B) or the lower sensing data (SL2B) from the latch 226 through the node Q3, inverts the received data (SL1B or SL2B) and outputs the inverted data.

The data input circuit 240 has NMOS transistors 241, 242, and outputs input data (D1B or D2), which are received from the Y-gate circuit YG1 through a data I/O node ION, to the latch 226 of the upper-bit register 220 through the node Q1 or Q2 according to data input signals (DI1, nDI1).

The upper bit verify circuit 250 is connected to the node Q2, and receives one of the inversed upper sensing data (SM), the inversed input data (D1) and the input data (D2) from the latch 226. The upper bit verify circuit 250 outputs the second or first upper verify data (SMVD1 or FMVD1) to the first data verify line MVL1 according to the received data (one of SM, D1 and D2). Preferably, the upper bit verify circuit 250 can operate as a PMOS transistor. In this case, when the received data (one of SM, D1 and D2) is a logic Low (i.e., "0"), the PMOS transistor 250 applies an internal voltage (VCC) to the first data verify line MVL1, so that the second or first upper verify data (SMVD1 or FMVD1) are output as a logical "1". To the contrary, when the received data (one of SM, D1 and D2) is a logic High (i.e., "1"), the PMOS transistor 250 does not apply the internal voltage (VCC) to the first data verify line MVL1. Therefore, the second or first upper verify data (SMVD1 or FMVD1) become a logical "0". The first data verify line MVL1 is initially set to a ground voltage level.

The lower bit verify circuit 260 is connected to the node Q4, and receives the inversed lower sensing data (SL2) or the lower sensing data (SL1) from the latch 236. The lower bit verify circuit 260 outputs the lower verify data (LVD1) to the second data verify line LVL1 in response to the inversed lower sensing data (SL2) or the lower sensing data (SL1). Preferably, the lower bit verify circuit 260 can operate as a PMOS transistor. In this case, when the lower sensing data (SL1) of a logic Low (i.e., "0") are received, the PMOS transistor 260 applies the internal voltage (VCC) to the second data verify line LVL1, so that the lower verify data (FLVD1 or SLVD1) are output as a logical "1". To the contrary, when the inversed lower sensing data (SL2) of a logic High (i.e., "1") are received, the PMOS transistor 260 does not apply the internal voltage (VCC) to the second data verify line LVL1. Therefore, the lower verify data (LVD1) becomes a logical "0". The second data verify line LVL1 is initially set to a ground voltage level.

The data transmission circuit 270 includes a first transmission circuit 271 and a second transmission circuit 272. The first and second transmission circuits 271, 272 can be implemented using a NMOS transistor. The first transmission circuit 271 outputs the inversed input data (D1) or the input data (D2), which are received from the inverter 227 of the upper-bit register 220, to the sensing node SO in response to the program control signal (MPGM). The second transmission circuit 272 outputs the inversed lower sensing data (SL2), which are received from the inverter 237 of the lower-bit register 230, to the sensing node SO in response to the program control signal (SPGM).

The data output circuit 280 includes a first output circuit 281 and a second output circuit 282. The first and second output circuits 281, 282 can be implemented using a NMOS transistor. The first output circuit 281 outputs the inversed upper sensing data (SM) to the Y-gate circuit YG1 through the data I/O node ION in response to the data output signal (MBDO). The second output circuit 282 outputs the inversed lower sensing data (SL2) to the Y-gate circuit YG1 through the data I/O node ION in response to the data output signal (SBDO). The precharge circuit 290 precharges the sensing node SO with the internal voltage (VCC) according to the precharge control signal (PRCH).

Figure 4:
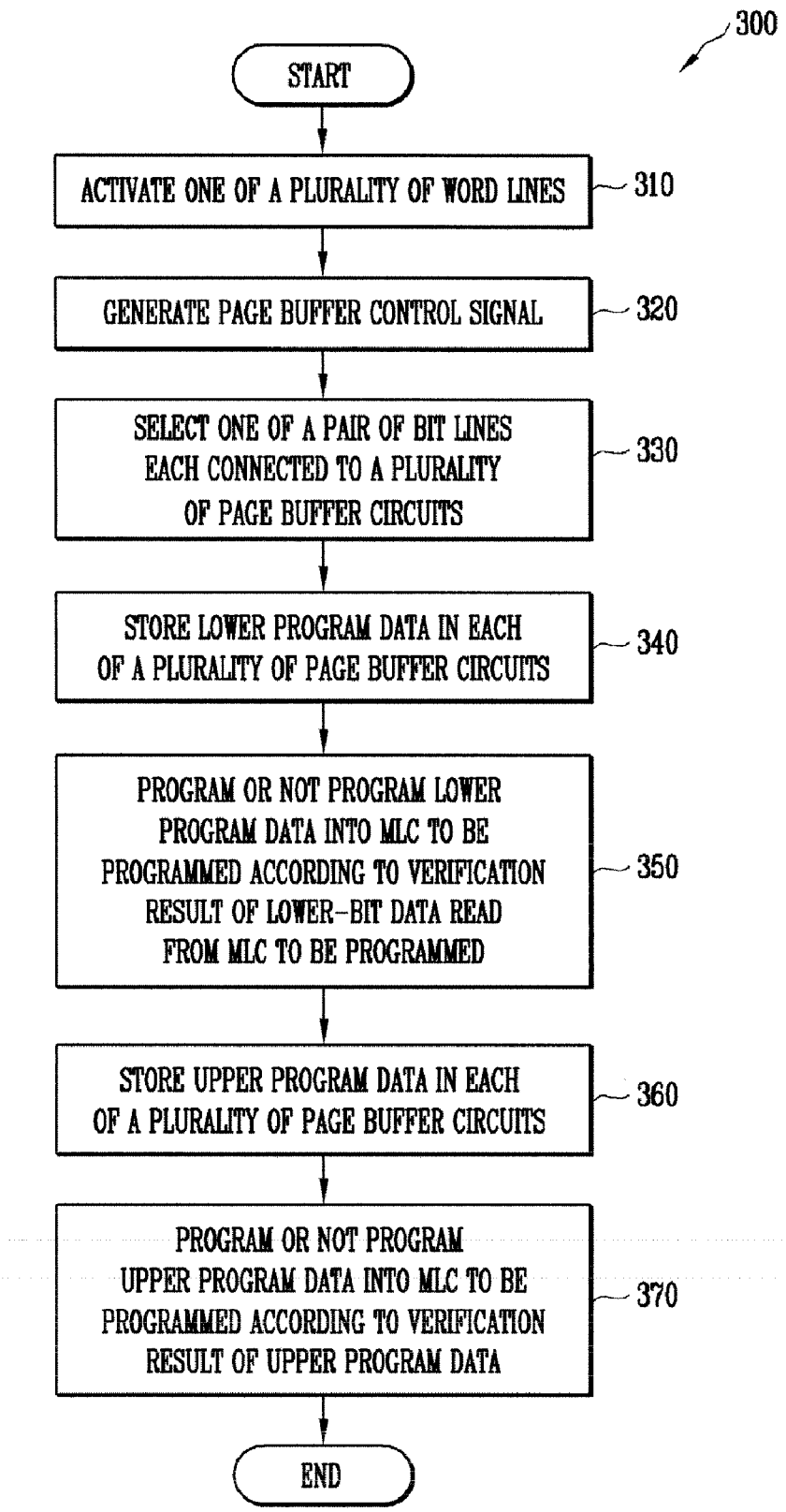
FIG. 4 is a flowchart illustrating a program process of a MLC by means of the page buffer circuit shown in FIG. 3.

Hereinafter, the program operation of the flash memory device 100 will be described in detail. FIG. 4 is a flowchart illustrating a lower-bit data program process of the memory cell by means of the page buffer circuit shown in FIG. 3.

Referring to FIG. 4, the X-decoder 120 decodes the row address signal (RADD) in response to the program command (PGM) and activates one of the word lines WL1 to WLJ according to the decoding result (S310). Furthermore, the Y-decoder 130 decodes the column address signal (CADD) in response to the program command (PGM) and generates the page buffer control signal (PBCTL) according to the decoding result (S320). In this case, the page buffer control signal (PBCTL) includes the discharge signals (DISCHe, DISCHo), the bit line select signals (BSLe, BSLo), the precharge control signal (PRCH), the program control signals (MPGM, SPGM), the read control signals (MREAD, LREAD1, LREAD2), the data input signals (DI1 to DIK, nDI1 to nDIK) and the data output signals (MBDO, SBDO). Furthermore, the Y-decoder 130 outputs the I/O control signals (YS1 to YSK) the according to the decoding result. Each of the plurality of page buffer circuits PB1 to PBK selects one of the pair of bit lines connected thereto in response to the discharge signals (DISCHe, DISCHo) and the bit line select signals (BSLe, BSLo) (S330). That is, the bit line select circuit 210 of each of the plurality of page buffer circuits PB1 to PBK connects one of the pair of bit lines to the sensing node SO.

Figure 5:
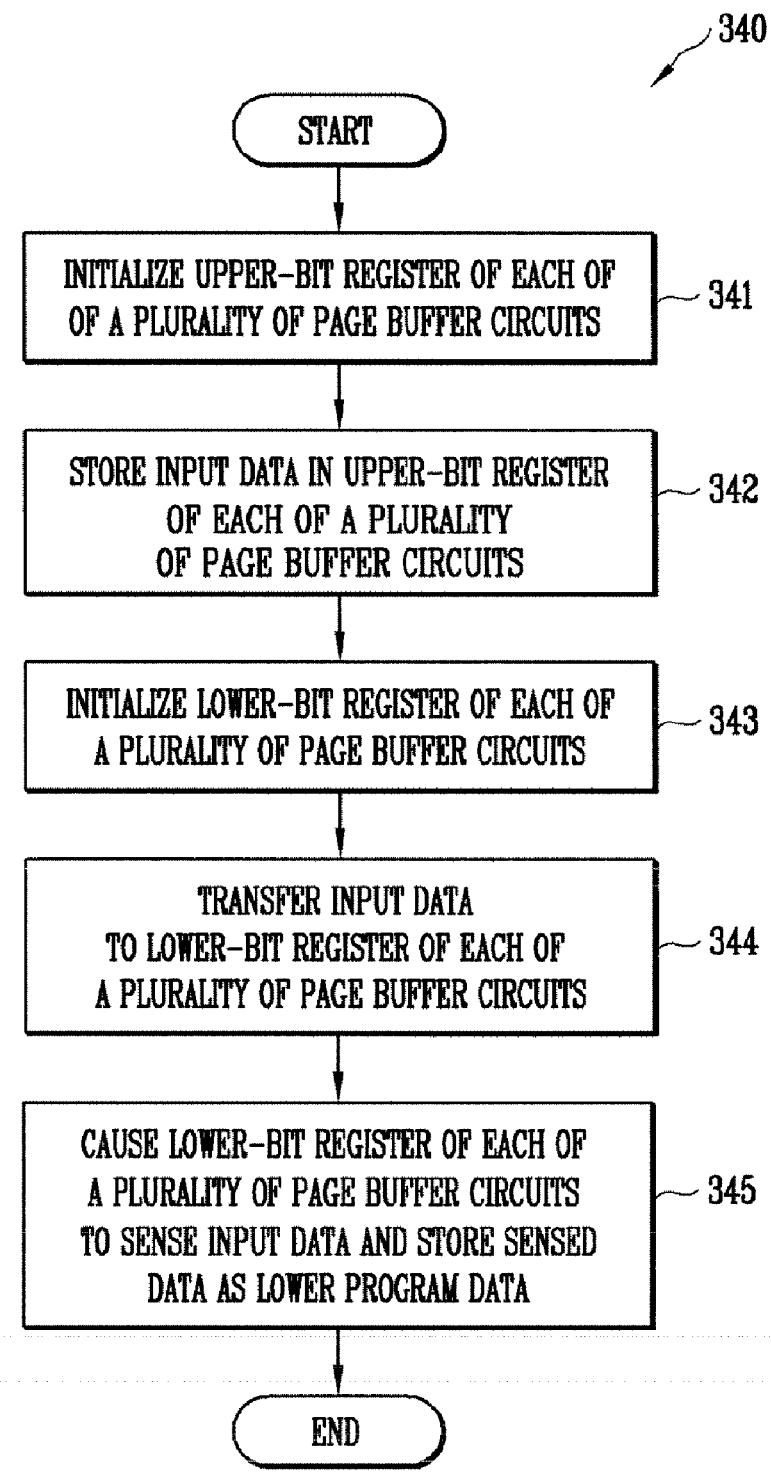
FIG. 5 is a detailed flowchart of a processing process (S340) shown in FIG. 4.

Thereafter, each of the plurality of page buffer circuits PB1 to PBK stores lower program data according to the precharge control signal (PRCH), the program control signal (MPGM) and the read control signals (MREAD, LREAD1, LREAD2) (S340). The step 340 will be described in more detail below with reference to FIGS. 5 and 7. The upper-bit register 220 of each of the plurality of page buffer circuits PB1 to PBK is initialized according to the precharge control signal (PRCH) and the read control signal (MREAD) (S341). This will be described in more detail. Referring to an upper-bit register initialization period (P1) of FIG. 7, the precharge control signal (PRCH) is disabled and the read control signal (MREAD) is enabled. The precharge circuit 290 of each of the plurality of page buffer circuits PB1 to PBK precharges the sensing node SO with the internal voltage (VCC) according to the precharge control signal (PRCH). The sensing circuit 221 of the upper-bit register 220 of each of the plurality of page buffer circuits PB1 to PBK senses a voltage of the sensing node SO in response to the read control signal (MREAD), and outputs the upper sensing data (SMB) to the node Q1. At this time, since the sensing node SO is in the internal voltage (VCC) level, both the NMOS transistors 224, 225 of the sensing circuit 221 are turned on, so that the upper sensing data (SMB) of a ground voltage (VSS) level are output to the node Q1. As a result, the latch circuit 222 of the upper-bit register 220 latches the upper sensing data (SMB) of a logic Low and is thus initialized.

Figure 7:
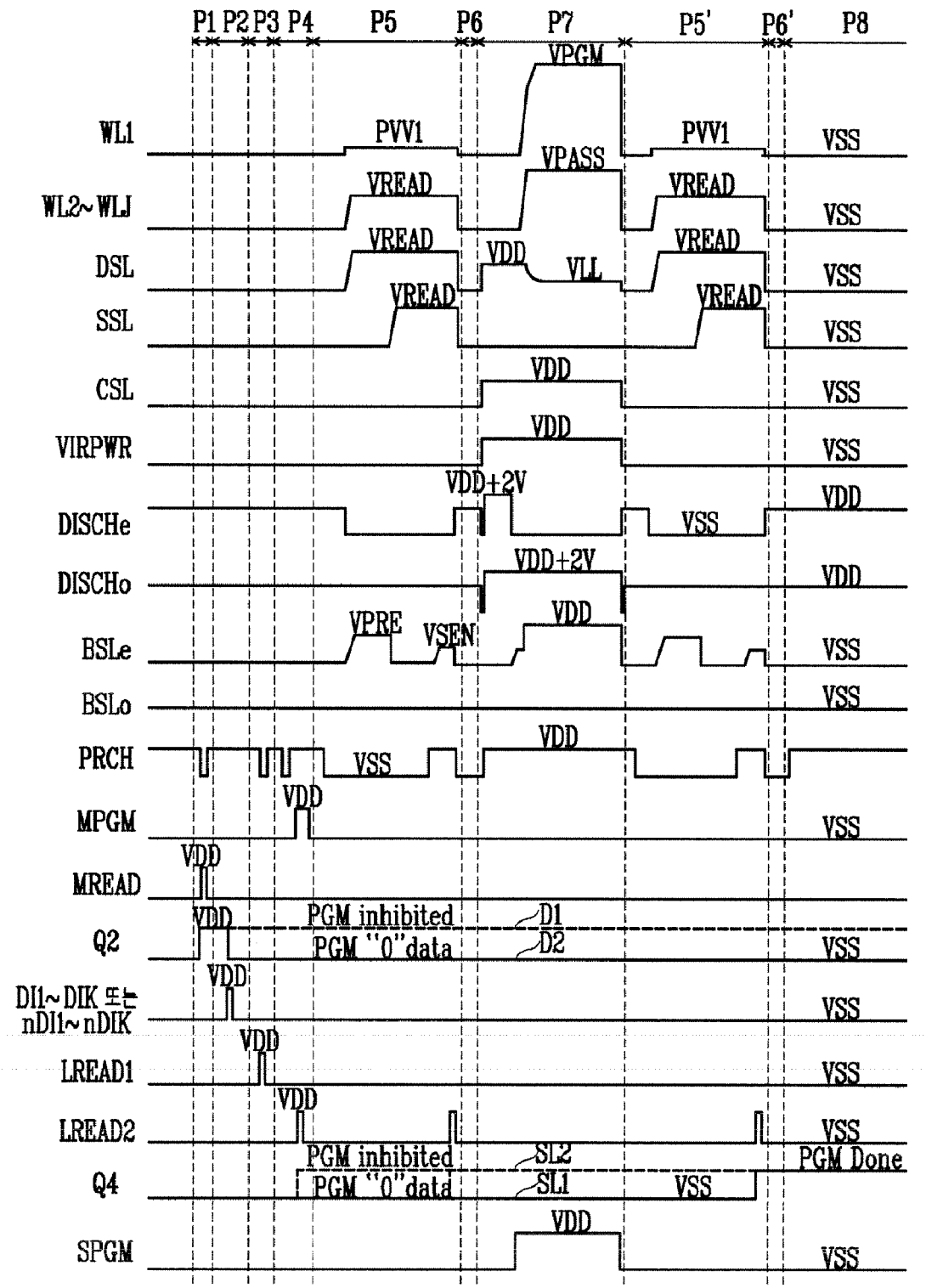
FIG. 7 is a timing diagram of signals related to the processing processes (S340, S350) shown in FIGS. 5 and 6.

Referring next to a data input period (P2) of FIG. 7, the input data (D1B or D2) are stored in the upper-bit register 220 of each of the plurality of page buffer circuits PB1 to PBK in response to the data input signals (DI1 to DIK, nDI1 to nDIK) (S342). To be more specific, when the I/O control signals (YS1 to YSK) are enabled, the Y-gate circuits YG1 to YGK connect the data I/O node ION of each of the page buffer circuits PB1 to PBK to the data I/O line DIO. At this time, the data I/O line DIO is set to the ground voltage (VSS) level. Furthermore, the data input circuit 240 of each of the plurality of page buffer circuits PB1 to PBK connects one of the nodes Q1, Q2 to the data I/O node ION in response to the data input signals (DI1 to DIK, nDI1 to nDIK). As a result, one of the nodes Q1, Q2 becomes the ground voltage (VSS) level. Therefore, the input data (D1B) of a logical "0" or the input data (D2) of a logical "0" are stored in the upper-bit register 220 of each of the page buffer circuits PB1 to PBK.

For example, if the data input signals (DI1, nDI2) are enabled and the data input signals (nDI1, DI2) are disabled, the input data (D1B) are stored in the upper-bit register 220 of the page buffer circuit PB1, and the input data (D2) are stored in the upper-bit register 230 of the page buffer circuit PB2. In other words, the latch circuit 222 of the upper-bit register 220 of the page buffer circuit PB1 latches the input data (D1B), and the latch circuit 222 of the upper-bit register 230 of the page buffer circuit PB2 latches the input data (D2). As a result, the latch circuit 222 of the page buffer circuit PB1 outputs the inversed input data (D1) of a logical "1" to the node Q2, and the latch circuit 222 of the page buffer circuit PB2 outputs the input data (D2) of a logical "0" to the node Q2. Accordingly, as shown in FIG. 7, as some of the data input signals (DI1 to DIK) and some of the data input signals (nDI1 to nDIK) are selectively enabled, the inversed input data (D1) or the input data (D2) are output to the node Q2 of each of the page buffer circuits PB1 to PBK.

Referring to a lower-bit register initialization period (P3) of FIG. 7, the lower-bit register 230 of each of the plurality of page buffer circuits PB1 to PBK is initialized according to the precharge control signal (PRCH) and the read control signal (LREAD1), and outputs the lower sensing data (SL1) of a logical "0" to the node Q4 (S343). The initialization process of the lower-bit register 230 is similar to that of the upper-bit register 220. Detailed description thereof will be thus omitted.

Referring to a data transfer period (P4) of FIG. 7, data stored in the upper-bit register 220 of each of the plurality of page buffer circuits PB1 to PBK are transferred to the lower-bit register 230 according to the precharge control signal (PRCH), the program control signal (MPGM) and the read control signal (LREAD2) (S344). This will be described in more detail. As shown in FIG. 7, after the precharge control signal (PRCH) is disabled, the program control signal (MPGM) and the read control signal (LREAD2) are enabled at the same time. The precharge circuit 290 of each of the plurality of page buffer circuits PB1 to PBK precharges the sensing node SO with the internal voltage (VCC) according to the precharge control signal (PRCH). Furthermore, the data transmission circuit 270 of each of the plurality of page buffer circuits PB1 to PBK outputs the inversed input data (D1) or the input data (D2), which are received from the node Q2, to the lower-bit register 230 through the sensing node SO in response to the program control signal (MPGM). The lower-bit register 230 of each of the plurality of page buffer circuits PB1 to PBK senses the inversed input data (D1) or the input data (D2) of the sensing node SO in response to the read control signal (LREAD2), and stores the sensed data as lower program data (S345). This will be described below in more detail.

The sensing circuit 231 of the lower-bit register 230 of each of the plurality of page buffer circuits PB1 to PBK senses the inversed input data (D1) or the input data (D2) in response to the read control signal (LREAD2), and outputs the lower sensing data (SL2B) to the node Q3. The latch circuit 232 of the lower-bit register 230 of each of the plurality of page buffer circuits PB1 to PBK latches the lower sensing data (SL2B) and outputs the inversed lower sensing data (SL2) to the node Q4. For example, if the data transmission circuit 270 outputs the inversed input data (D1) of a logical "1" to the sensing node SO, the NMOS transistor 235 of the sensing circuit 231 is turned on to generate the lower sensing data (SL2B) of a logical "0" to the node Q3. As a result, the latch circuit 232 outputs the inversed lower sensing data (SL2) of a logical "1" to the node Q4. Furthermore, if the data transmission circuit 270 outputs the input data (D2) of a logical "0" to the sensing node SO, the latch circuit 232 keeps initialized since the NMOS transistor 235 is turned off. Therefore, the lower sensing data (SL1) of a logical "0" are continuously output to the node Q4. Accordingly, the lower sensing data (SL1) or the inversed lower sensing data (SL2) are stored in the lower-bit register 230 of each of the page buffer circuits PB1 to PBK as lower program data.

Figure 6:
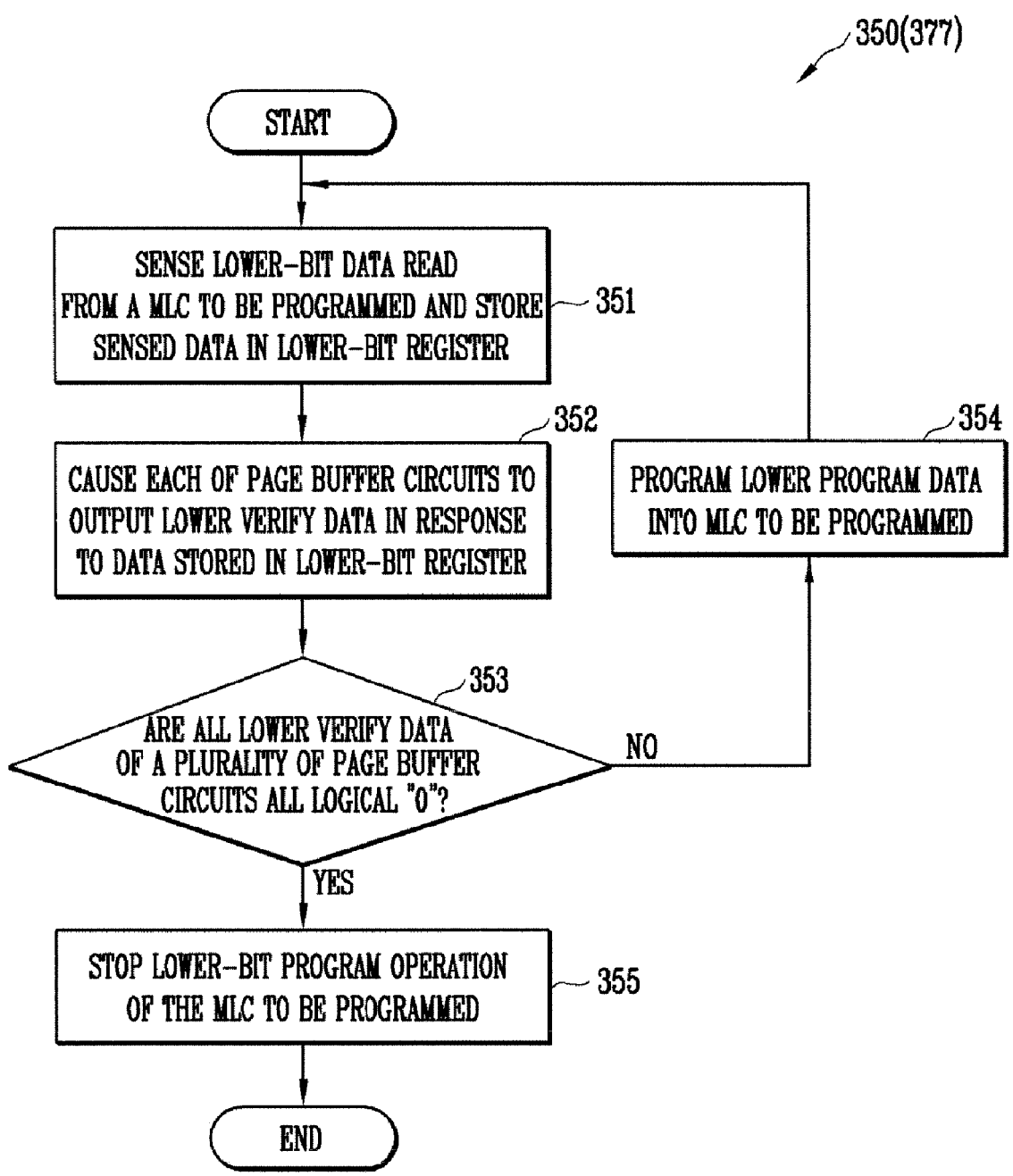
FIG. 6 is a detailed flowchart of a processing process (S350) shown in FIG. 4.
Figure 8:
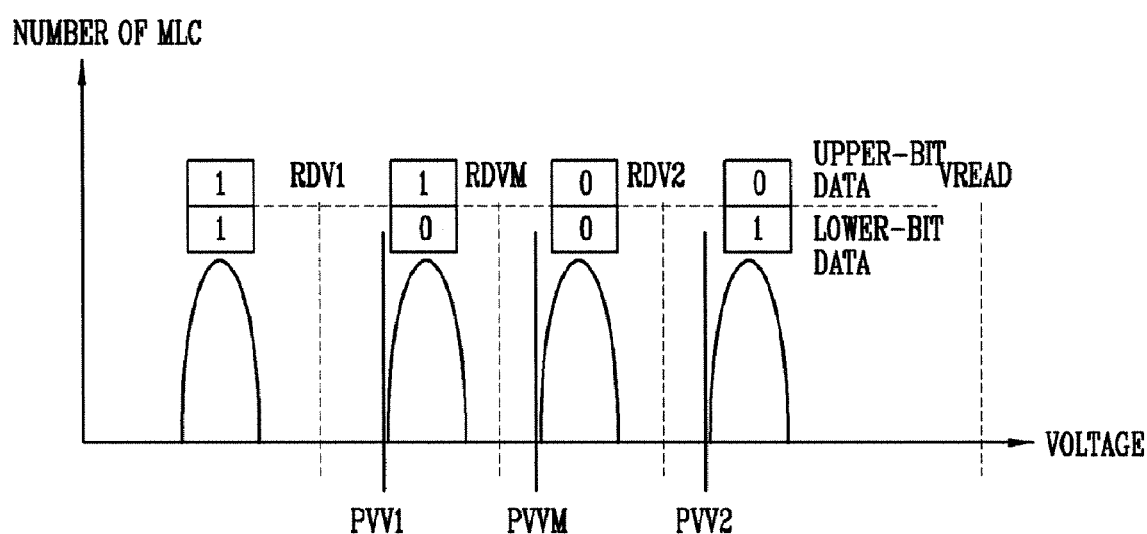
FIG. 8 is a view showing threshold voltage distribution of MLCs corresponding to data programmed by the page buffer circuit of the flash memory device according to the present invention.

Referring again to FIG. 4, each of the page buffer circuits PB1 to PBK verifies lower-bit data (LRD) read from a MLC to be programmed, which is connected to one of the selected bit lines (one of BLe1 to BLeK or one of BLo1 to BLoK), and programs or does not program the lower program data into the MLC to be programmed according to the verification result (S350). In this case, step 350 will be described in more detail below with reference to FIGS. 6 to 8. Referring to a lower-bit data read period (P5) of FIG. 7, the precharge circuit 290 of each of the page buffer circuits PB1 to PBK precharges the sensing node SO with the internal voltage (VCC), similar to the above description. Furthermore, a verify voltage (PVV1) is applied to an activated (i.e., selected) word line (e.g., WL1), and a read voltage (VREAD) is applied to non-selected word lines (e.g., WL2 to WLJ), the drain select line DSL and the source select line SSL. Referring to FIG. 8, the read voltage (VREAD) is higher than the verify voltage (PVV1), and the verify voltage (PVV1) is higher than a threshold voltage of a MLC that is not programmed (i.e., a MLC in which data "11" are stored). As a result, the lower-bit data (LRD) read from a MLC to be programmed, which is connected to the selected word line WL1 and the selected bit line (e.g., one of BLe1 to BLeK) are output to the sensing node SO of each of the page buffer circuits PB1 to PBK. At this time, if the data "11" are stored in the MLC to be programmed, the MLC to be programmed are turned on to output the lower-bit data (LRD) of a logical "0" to the sensing node SO. Furthermore, if data ("10" or "00" or "01") other than the data "11" are stored in the MLC to be programmed, the MLC to be programmed are turned on to output the lower-bit data (LRD) of a logical "1" to the sensing node SO.

Thereafter, if the read control signal (LREAD2) is enabled, the sensing circuit 231 of each of the page buffer circuits PB1 to PBK senses the lower-bit data (LRD) of the sensing node SO and outputs the lower sensing data (SL2B) to the node Q3. At this time, when the lower-bit data (LRD) is a logical "1", the sensing circuit 231 outputs the lower sensing data (SL2B) of a logical "0" to the node Q3. For example, at step S345, if the lower sensing data (SL1) are stored in the lower-bit register 230 as lower program data, the lower-bit register 230 is updated with the lower sensing data (SL2B). Furthermore, at step 345, if the inversed lower sensing data (SL2) are stored in the lower-bit register 230 as lower program data, the lower-bit register 230 keeps the inversed lower sensing data (SL2). To the contrary, when the lower-bit data (LRD) are a logical "0", the NMOS transistor 234 of the sensing circuit 231 is kept turned off, and the lower-bit register 230 maintains the lower program data (SL1 or SL2) that are stored at step 345. Consequently, the lower sensing data (SL2B) or the lower sensing data (SL1), which are sensed by the sensing circuit 231, are stored in the latch circuit 232 of each of the page buffer circuits PB1 to PBK according to a logical level of the lower-bit data (LRD) (S351).

Referring to a lower data verify period (P6) of FIG. 7, the precharge control signal (PRCH) is disabled and the discharge signals (DISCHe, DISCHo) are enabled. As a result, each of the page buffer circuits PB1 to PBK precharges the sensing node SO with the internal voltage (VCC) and precharges the bit lines BLe1 to BLeK, BLo1 to BLoK with a voltage (VIRPWR). Furthermore, during the period (P6), the lower bit verify circuit 260 of each of the page buffer circuits PB1 to PBK outputs the lower verify data (one of LVD1 to LVDK) to the second data verify line (one of LVL1 to LVLK) in response to the lower sensing data (SL1 or SL2) received through the node Q4 (S352). For example, if the lower bit verify circuit 260 receives the lower sensing data (SL1), the page buffer circuit PB1 outputs the lower verify data (LVD1) of a logical "1" to the second data verify line LVL1. Furthermore, in the case where the lower bit verify circuit 260 receives the lower sensing data (SL2), the page buffer circuit PB1 outputs the lower verify data (LVD1) of a logical "0" to the second data verify line LVL1.

Meanwhile, during the period (P6), the verify data decision unit 140 determines whether the lower verify data (LVD1 to LVDK), which are received through the second data verify lines LVL1 to LVLK, are all a logical "0" (S353). The verify data decision unit 140 enables the verify signal (LVR) when some or all of the lower verify data (LVD1 to LVDK) are a logical "1". As a result, as referenced in the lower bit program period (P7) of FIG. 7, the X-decoder 120 applies the program voltage (VPGM) to the selected word line WL in response to the verify signal (LVR), and applies the pass voltage (VPASS) to the non-selected word lines WL2 to WLJ. At this time, if the program control signal (SPGM) is enabled, the data transmission circuit 270 of each of the page buffer circuits PB1 to PBK outputs the lower program data (SL1 or SL2) stored in the lower-bit register 230 to the sensing node SO. Therefore, the lower program data (SL1 or SL2) are programmed into a MLC to be programmed, which is connected to the word line WL1 and the selected bit line (one of BLe1 to BLeK) (S354). Thereafter, as shown in periods (P5', P6', P7) of FIG. 7, steps 351 to 354 are repeatedly performed until the lower verify data (LVD1 to LVDK) all become a logical "0". Furthermore, the verify data decision unit 140 disables the verify signal (LVR) when the lower verify data (LVD1 to LVDK) are all a logical "0". As a result, since the X-decoder 120 does not apply the program voltage (VPGM) to the selected word line WL in response to the verify signal (LVR), the lower-bit program operation of the MLC to be programmed is stopped (S355) (see the period (P8) of FIG. 7). Consequently, as shown in FIG. 8, the threshold voltage of the MLC to be programmed becomes a voltage level corresponding to the data "10".

Figure 9:
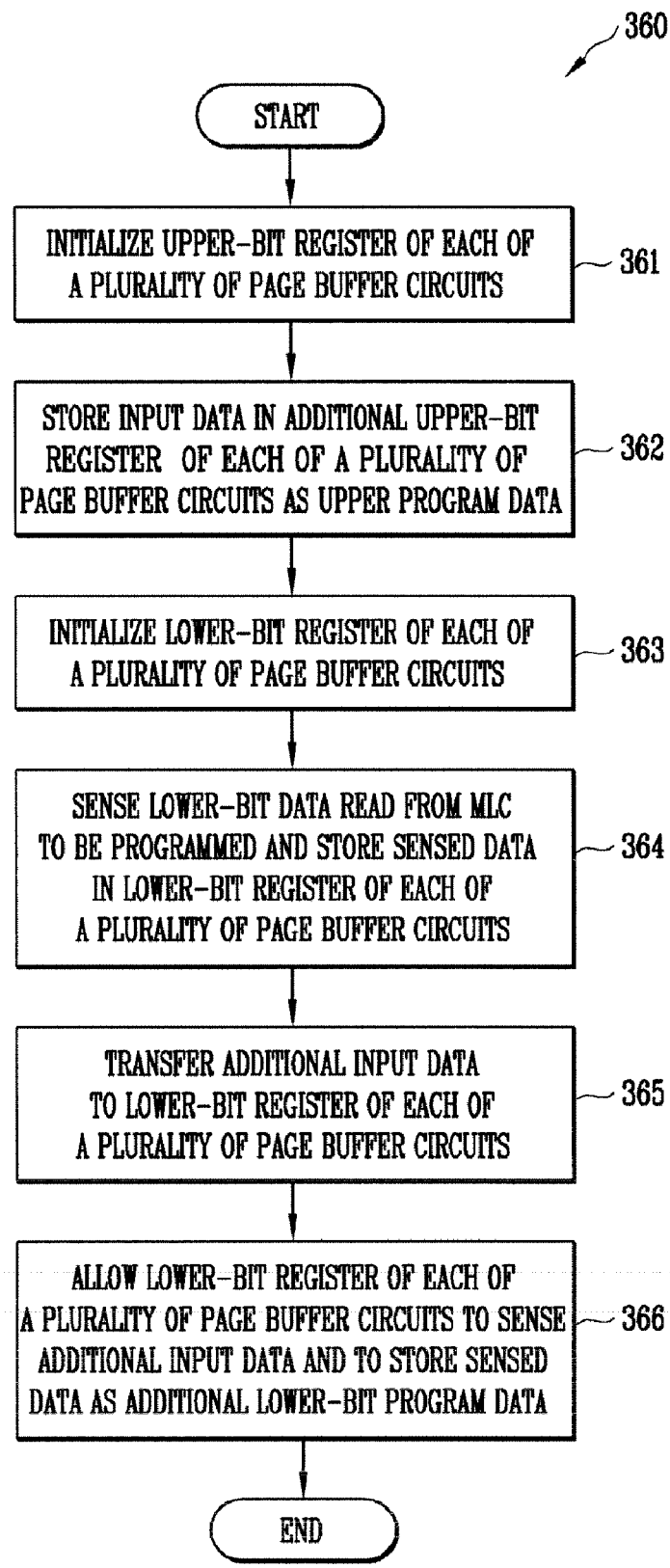
FIG. 9 shows a detailed flowchart of a processing process (S360) shown in FIG. 4.
Figure 10:
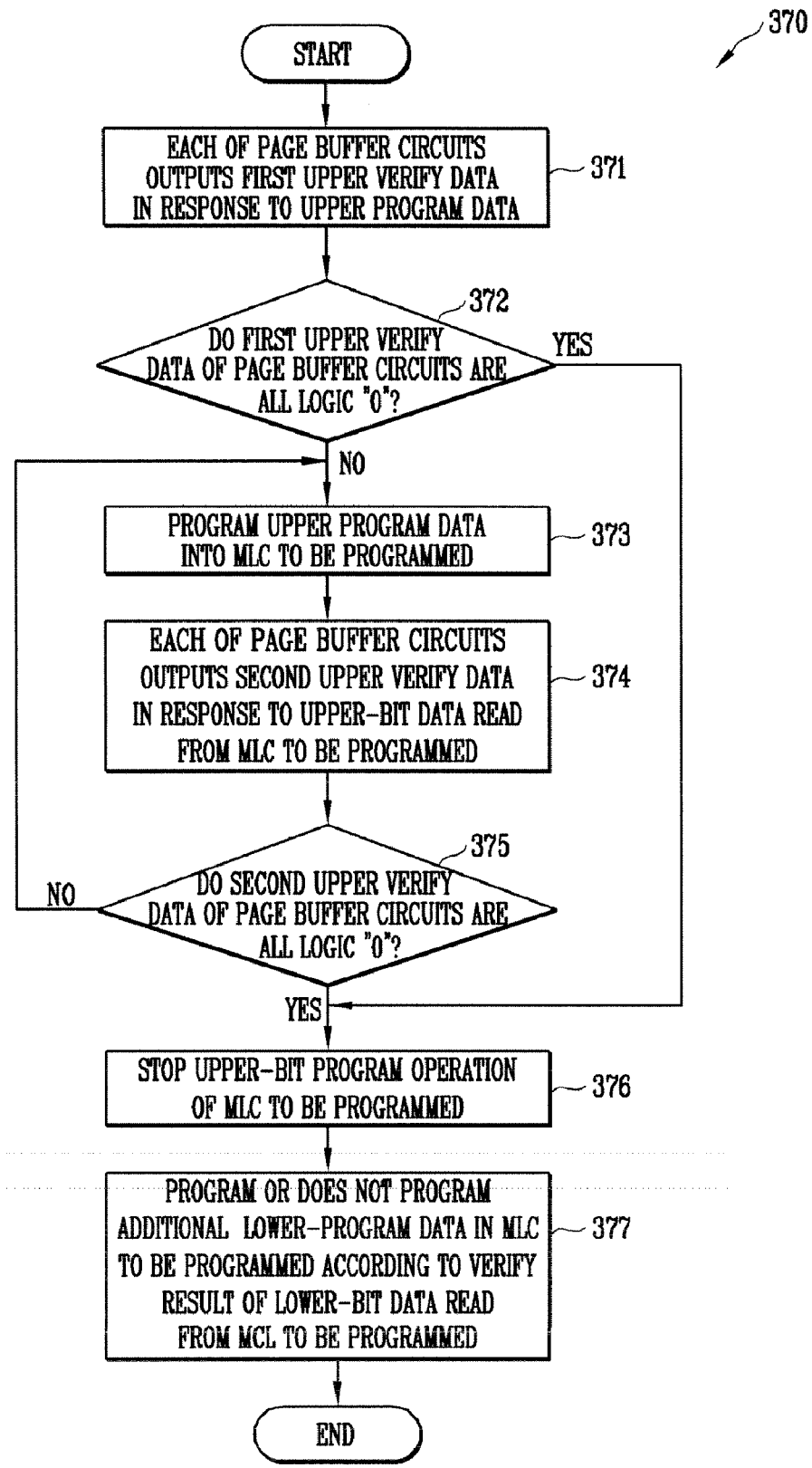
FIG. 10 shows a detailed flowchart of a processing process (S370) shown in FIG. 4.

Referring back to FIG. 4, each of the plurality of page buffer circuits PB1 to PBK stores upper program data (i.e., the input data (D1 or D2)) according to the precharge control signal (PRCH), the program control signals (MPGM, SPGM) and the read control signals (MREAD, LREAD1, LREAD2) (S360). Step 360 will be described in more detail reference to FIGS. 8, 9 and 11. As shown in periods (T1 to T3, T5) of FIG. 11, the operation of the page buffer circuits PB1 to PBK at steps 361 to 363, 365 and 366 other than step 364 is the same as that of the page buffer circuits PB1 to PBK at steps 341 to 345, which has been described with reference to FIG. 5. Detailed description thereof will be thus omitted.

Referring to the period T4 of FIG. 11, at step 364, the read voltage (RDV1) is applied to the selected word line WL1 and the read voltage (VREAD) is applied to non-selected word lines WL2 to WLJ, the drain select line DSL and the source select line SSL. As shown in FIG. 8, the read voltage (RDV1) is lower than the verify voltage (PVV1), but higher than a threshold voltage of a MLC that is not programmed (i.e., a MLC having data "11" stored therein). The operation of the page buffer circuits PB1 to PBK at step 364 except for the read voltage (RDV1) applied to the word line WL1 is the same as that of the page buffer circuits PB1 to PBK at step 351, which has been described with reference to FIG. 6. Detailed description thereof will be thus omitted.

Referring back to FIG. 4, each of the page buffer circuits PB1 to PBK verifies the upper program data, and programs or does not program the upper program data into a MLC to be programmed according to the verification result (S370). Step 370 will be described in more detail with reference to FIGS. 8, and 11. During a period T6 of FIG. 11, similar to the step 352, the upper bit verify circuit 250 of each of the page buffer circuits PB1 to PBK outputs the first upper verify data (one of FMVD1 to FMVDK) to the first data verify line (one of MVL1 to MVLK) in response to the upper program data (D1 or D2) received through the node Q2 (S371). Furthermore, during the period (T6), the verify data decision unit 140 determines whether the first upper verify data (FMVD1 to FMVDK) received through the first data verify lines MVL1 to MVLK are all a logical "0" (S372). The verify data decision unit 140 enables the verify signal (FMVR) when the first upper verify data (some of or all FMVD1 to FMVDK) are a logical "1". As a result, as shown in an upper-bit program period T7 of FIG. 11, the X-decoder 120 applies the program voltage (VPGM) to the selected word line WL and the pass voltage (VPASS) to the non-selected word lines WL2 to WLJ, in response to the verify signal (FMVR). At this time, if the program control signal (MPGM) is enabled, the data transmission circuit 270 of each of the page buffer circuits PB1 to PBK outputs the upper program data (D1 or D2) stored in the upper-bit register 220 to the sensing node SO. Therefore, the upper program data (D1 or D2) are programmed into a MLC to be programmed, which is connected to the word lines (WL1 and one of the selected bit lines BLe1 to BleK) (S373).

Thereafter, in an upper-bit data read period (T8) of FIG. 11, the operation of the page buffer circuits PB1 to PBK is same as that of the lower-bit data read period (P5). To be more specific, the verify voltage (PVVM) is applied to he selected word line WL1 and the read voltage (VREAD) is applied to non-selected word lines WL2 to WLJ, the drain select line DSL, and the source select line SSL. Referring to FIG. 8, the verify voltage (PVVM) is lower than the read voltage (VREAD), but higher than a threshold voltage of a MLC into which lower-bit data are programmed (i.e., a MLC having the data "10" stored therein). As a result, upper-bit data (MRD) read from a MLC to be programmed, which is connected to the selected word line WL1 and the selected bit lines (one of BLe1 to BLeK) are output to the sensing node SO of each of the page buffer circuits PB1 to PBK. At this time, in the event that the data of "10" are stored in the MLC to be programmed, the MLC to be programmed is turned on to output the upper-bit data (MRD) of a logical "0" to the sensing node SO. Furthermore, in the case where data ('00' or "01") other than the data "11" and "10" are stored in the MLC to be programmed, the MLC to be programmed is turned off to output the upper-bit data (MRD) of a logical "1" to the sensing node SO.

Thereafter, when the read control signal (MREAD) is enabled, the sensing circuit 221 of each of the page buffer circuits PB1 to PBK senses the upper-bit data (MRD) of the sensing node SO and generates the upper sensing data (SMB) to the node Q1. At this time, when the upper-bit data (MRD) is a logical "1", the sensing circuit 221 outputs the upper sensing data (SMB) of a logical "0" to the node Q1. The latch circuit 222 latches the upper sensing data (SMB) and outputs the inversed upper sensing data (SM) of a logical "1" to the node Q2. Furthermore, when the upper-bit data (MRD) is a logical "0", the NMOS transistor 225 of the sensing circuit 221 is kept turned off. As a result, the latch circuit 222 maintains the data (i.e., the upper program data (D1 or D2)) that are previously latched (i.e., at step 362).

Thereafter, during a period (T6') of FIG. 11, the upper bit verify circuit 250 of each of the page buffer circuits PB1 to PBK outputs the second upper verify data (one of SMVD1 to SMVDK) to the first data verify line (one of MVL1 to MVLK) in response to the upper-bit data (MRD) or the upper program data (D1 or D2) received through the node Q2 (S374). Furthermore, during the period (T6'), the verify data decision unit 140 determines whether the second upper verify data (SMVD1 to SMVDK), which are received through the first data verify lines MVL1 to MVLK, are all a logical "0" (S375). The verify data decision unit 140 enables the verify signal (SMVR) when some of or all the second upper verify data (SMVD1 to SMVDK) are a logical "1".

Thereafter, as shown in periods (T6', T7, T8) of FIG. 11, steps 373 to 375 are repeatedly performed until all the second upper verify data (SMVD1 to SMVDK) become a logical "0". Furthermore, when all the first upper verify data (FMVD1 to FMVDK) are a logical "0" at step 372 or all the second upper verify data (SMVD1 to SMVDK) are a logical "0" at step 375, the verify data decision unit 140 disables the verify signal (FMVR or SMVR). As a result, the X-decoder 120 does not apply the program voltage (VPGM) to the selected word line WL according to the verify signal (FMVR or SMVR), so that the upper-bit program operation of the MLC to be programmed is stopped (S376). As a result, as shown in FIG. 8, a threshold voltage of the MLC to be programmed becomes a voltage level corresponding to the data "00".

Alternately, in the case where the data "0" must be programmed into the MLC to be programmed, step 377 can be further performed after step 376. In the event that the data "00" must be programmed into the MLC to be programmed, however, step 377 is not performed. The operation of the page buffer circuits PB1 to PBK at step 377 is the same as that of the page buffer circuits PB1 to PBK at step 350, which has been described with reference to FIG. 6, except for one thing as shown in the periods (T9, T10, T9', T10") of FIG. 11. Detailed description on step 377 will be thus omitted. The difference between steps 350 and 377 is that the verify voltage (PVV2) is applied to the selected word line WL1 in the upper-bit data read periods (T9, T9'). As shown in FIG. 8, the verify voltage (PVV2) is lower than the read voltage (VREAD), but higher than a threshold voltage of a programmed MLC (i.e., a M LC having data "00" stored therein). As described above, the semiconductor memory device 100 including the page buffer circuits PB1 to PBK can perform the program operation of a MLC using the data verify circuits 250 and 260 even without the data compare circuit.

Although the foregoing description has been made with reference to the preferred embodiments, it is to be understood that changes and modifications of the present invention may be made by the ordinary skilled in the art without departing from the spirit and scope of the present invention and appended claims.

As described above, according to the present invention, a page buffer circuit can perform a program operation of a MLC using a data verify circuit even without a data compare circuit. Accordingly, the present invention is advantageous in that an occupation area can be reduced and the size of a flash memory device can also be reduced.

What is claimed as new and desired to be protected by Letters Patent of the United States is:

1. A page buffer circuit of a flash memory device having a plurality of Multi-Level Cells (MLCs) connected to at least one pair of bit lines, comprising:
    an upper-bit register configured to at least one of sense a voltage of a sensing node, store upper sensing data and output inversed upper sensing data, and store input data and output inversed input data, in response to a first read control signal;
    a lower-bit register configured to at least one of sense a voltage of the sensing node, store first lower sensing data and output inversed first lower sensing data, in response to a second read control signal, and sense a voltage of the sensing node, store second lower sensing data and output inversed second lower sensing data, in response to a third read control signal;
    an upper bit verify circuit configured to receive one of the inversed upper sensing data and the inversed input data and output upper verify data according to the received data; and
    a lower bit verify circuit configured to receive the first lower sensing data or the inversed second lower sensing data, and output lower verify data according to the received data.

2. The page buffer circuit as claimed in claim 1, further including:
    a bit line select circuit configured to select one of the pair of bit lines according to a bit line select signal and a discharge signal, and connect the one of the pair of selected bit lines to the sensing node;
    a precharge circuit configured to precharge the sensing node with an internal voltage according to a precharge control signal;
    a data input circuit configured to output the input data, which are received from a Y-gate circuit through a data I/O node, to the upper-bit register according to data input signals;
    a data transmission circuit configured to at least one of output the inversed input data to the sensing node and the inversed second lower sensing data to the sensing node, according to a first program control signal and a second program control signal; and
    a data output circuit configured to output at least one of the inversed upper sensing data to the Y-gate circuit through the data I/O node and the inversed second lower sensing data to the Y-gate circuit through the data I/O node, in response to a first data output signal and a second data output signal, respectively.

3. The page buffer circuit as claimed in claim 1, wherein the upper bit verify circuit outputs the upper verify data as a logical "1" by applying an internal voltage to a first data verify line when the received data are a logic Low, and outputs the upper verify data as a logical "0" by stopping the supply of the internal voltage to the first data verify line when the received data are a logic High, and
    the lower bit verify circuit outputs the first lower sensing data or the lower verify data as a logical "1" by applying the internal voltage to a second data verify line when the received data are a logic Low, and
    outputs the lower verify data as a logical "0" by stopping the supply of the internal voltage to the second data verify line when the received data are a logic High.

4. The page buffer circuit as claimed in claim 2, wherein the upper-bit register includes:
    a sensing circuit configured to sense a voltage of the sensing node and generate the upper sensing data, in response to the first read control signal;
    a latch circuit configured to latch the upper sensing data and output the inversed upper sensing data, or latch the input data and output the inversed input data; and
    a latch reset circuit configured to initialize the latch circuit in response to a reset control signal.

5. The page buffer circuit as claimed in claim 4, wherein when the first read control is enabled, the sensing circuit senses a voltage of the sensing node, which is decided according to upper-bit data read from one of the plurality of MLCs connected to the selected bit line, and outputs the upper sensing data.

6. The page buffer circuit as claimed in claim 2, wherein the lower-bit register includes:
    a sensing circuit configured to sense a voltage of the sensing node in response to one of the second or third read control signal, and to generate the first or second lower sensing data, respectively; and
    a latch circuit configured to at least one of latch the first lower sensing data and output the inversed first lower sensing data, and latch the second lower sensing data and output the inversed second lower sensing data.

7. The page buffer circuit as claimed in claim 6, wherein when the third read control is enabled, the sensing circuit at least one of senses a voltage of the sensing node, which is decided according to lower-bit data read from one of the plurality of MLCs connected to the selected bit line and outputs the second lower sensing data, and senses a voltage of the sensing node, which is decided according to the inversed input data, and outputs the second lower sensing data.

8. The page buffer circuit as claimed in claim 2, wherein the data transmission circuit includes a first transmission circuit configured to output the inversed input data to the sensing node according to the first program control signal, and a second transmission circuit configured to output the inversed second lower sensing data to the sensing node in response to the second program control signal, and the data output circuit includes a first output circuit configured to output the inversed upper sensing data to the Y-gate circuit through the data I/O node in response to the first data output signal, and a second output circuit configured to output the inversed second lower sensing data to the Y-gate circuit through the data I/O node in response to the second data output signal.

9. A flash memory device, comprising:
a memory cell array having a plurality of MLCs, each connected to a plurality of pairs of bit lines and a plurality of word lines;
a plurality of page buffer circuits disposed corresponding to the plurality of pairs of bit lines, respectively, wherein each of the plurality of page buffer circuits outputs data, which will be programmed, to one of MLCs connected to a corresponding pair of bit lines and generates upper verify data and lower verify data, at the time of a program operation, and stores data read from one of the MLCs connected to the pair of bit lines at the time of a read operation;
a plurality of Y-gate circuits connected to the plurality of page buffer circuits, respectively, and a data I/O line, wherein each of the plurality of Y-gate circuits outputs data to be programmed, which are received through the data I/O line, to a corresponding page buffer circuit in response to an I/O control signal at the time of the program operation, and outputs data, which are received from the corresponding page buffer circuit, to the data I/O line at the time of the read operation; and
a verify data decision unit configured to determine logical values of the upper verify data respectively received from the plurality of page buffer circuits through the first data verify lines, output a first verify signal according to the determination result, determines logical values of the lower verify data respectively received from the plurality of page buffer circuits through the second data verify lines, and output a second verify signal according to the determination result.

10. The flash memory device as claimed in claim 9, further including:
an X-decoder configured to decode a row address signal in response to at least one of a program command and a read command and to activate one of the plurality of word lines according to the decoding result, and accordingly to apply or not apply a program voltage to the activated word line in response to at least one of the first and second verify signals; and
a Y-decoder configured to decode a column address signal in response to at least one of the program command and the read command, and output page buffer control signals and the I/O control signals according to the decoding result.

11. The flash memory device as claimed in claim 10, wherein the page buffer control signals include first to third read control signals, bit line select signals, discharge signals, a precharge control signal, data input signals, a first program control signal, a second program control signal, a first data output signal and a second data output signal, and each of the plurality of page buffer circuits includes:
an upper-bit register configured to at least one of sense a voltage of the sensing node, store upper sensing data and output inversed upper sensing data, and store input data and output inversed input data, in response to a first read control signal;
a lower-bit register configured to at least one of sense a voltage of the sensing node, store first lower sensing data and output inversed first lower sensing data, in response to a second read control signal, and sense a voltage of the sensing node, store second lower sensing data and output inversed second lower sensing data, in response to a third read control signal;
an upper bit verify circuit configured to receive one of the inversed upper sensing data and the inversed input data and output upper verify data according to the received data; and
a lower bit verify circuit configured to receive at least one of the first lower sensing data and the inversed second lower sensing data and output lower verify data according to the received data.

12. The flash memory device as claimed in claim 11, wherein each of the plurality of page buffer circuits further includes:
a bit line select circuit configured to select one of the pair of corresponding bit lines according to the bit line select signals and the discharge signals, and connect the selected bit lines to the sensing node;
a precharge circuit configured to precharge the sensing node with an internal voltage according to the precharge control signal;
a data input circuit configured to output the input data, which are received from a Y-gate circuit through a data I/O node, to the upper-bit register according to the data input signals;
a data transmission circuit configured to output at least one of the inversed input data to the sensing node and the inversed second lower sensing data to the sensing node, according to the first program control signal and the second program control signal; and
a data output circuit configured to output at least one of the inversed upper sensing data to the Y-gate circuit through the data I/O node and the inversed second lower sensing data to the Y-gate circuit through the data I/O node, in response to the first data output signal and the second data output signal,
wherein the data to be programmed are the inversed second lower sensing data at the time of a lower-bit data program operation of one of the MLCs connected to the pair of bit lines, and the inversed input data at the time of an upper-bit data program operation of one of the MLCs connected to the pair of bit lines, and
the read data are the inversed second lower sensing data at the time of a lower-bit data read operation of one of the MLCs connected to the pair of bit lines, and are the inversed upper sensing data at the time of an upper-bit data read operation of one of the MLCs connected to the pair of bit lines.

13. The flash memory device as claimed in claim 11, wherein the upper bit verify circuit outputs the upper verify data as a logical "1" by applying an internal voltage to a first data verify line when the received data are a logic Low, and outputs the upper verify data as a logical "0" by stopping the supply of the internal voltage to the first data verify line when the received data are a logic High, and
the lower bit verify circuit outputs the lower verify data as a logical "1" by applying the internal voltage to a second data verify line when its received data are a logic Low, and outputs the lower verify data as a logical "0" by stopping the supply of the internal voltage to the second data verify line when the received data are a logic High.

14. The flash memory device as claimed in claim 12, wherein the upper-bit register includes:
a sensing circuit configured to sense a voltage of the sensing node and generate the upper sensing data, in response to the first read control signal;

a latch circuit configured to at least one of latch the upper sensing data and output the inversed upper sensing data, and latch the input data and output the inversed input data; and a latch reset circuit configured to initialize the latch circuit in response to a reset control signal.

15. The flash memory device as claimed in claim 14, wherein when the first read control is enabled, the sensing circuit senses a voltage of the sensing node, which is decided according to upper-bit data read from one of the plurality of MLCs connected to the selected bit line, and outputs the upper sensing data.

16. The flash memory device as claimed in claim 12, wherein the lower-bit register includes:

a sensing circuit configured to sense a voltage of the sensing node in response to at least one of the second and third read control signal, and generate at least one of the first and second lower sensing data; and a latch circuit configured to at least one of latch the first lower sensing data and output the inversed first lower sensing data, and latch the second lower sensing data and output the inversed second lower sensing data.

17. The flash memory device as claimed in claim 16, wherein when the third read control is enabled, the sensing circuit at least one of senses a voltage of the sensing node, which is decided according to lower-bit data read from one of the plurality of MLCs connected to the selected bit line and output the second lower sensing data, and senses a voltage of the sensing node, which is decided according to the inversed input data, and output the second lower sensing data.

18. The flash memory device as claimed in claim 12, wherein the data transmission circuit includes a first transmission circuit configured to output the inversed input data to the sensing node according to the first program control signal, and a second transmission circuit configured to output the inversed second lower sensing data to the sensing node in response to the second program control signal, and the data output circuit includes a first output circuit configured to output the inversed upper sensing data to the Y-gate circuit through the data I/O node in response to the first data output signal, and a second output circuit configured to output the inversed second lower sensing data to the Y-gate circuit through the data I/O node in response to the second data output signal.

19. A program operation method of a flash memory device having a plurality of MLCs respectively connected to a plurality of pairs of bit lines and a plurality of word lines, comprising the steps of:

allowing a X-decoder to decode a row address signal according to a program command, and activating one of the plurality of word lines according to the decoding result;

allowing a Y-decoder to decode a column address signal according to a program command, and generating page buffer control signals according to the decoding result;

allowing a plurality of page buffers, which are connected to the plurality of pairs of bit lines, respectively, and sensing nodes, to select one of the pair of corresponding bit lines according to the page buffer control signals, respectively;

storing lower program data in each of the plurality of page buffers according to each of the page buffer control signals;

allowing each of the plurality of page buffers to verify lower-bit data read from a MLC to be programmed, which is connected to the selected bit line and the activated word line, and programming or not programming the lower program data into the MLC to be programmed according to the verification result;

storing upper program data in each of the plurality of page buffers in response to each of the page buffer control signals; and allowing each of the plurality of page buffers to verify the upper program data, and programming or not programming the upper program data in the MLC to be programmed according to the verification result.

20. The program operation method as claimed in claim 19, wherein the page buffer control signals comprise first to third read control signals, a bit line select signal, a discharge signal, a precharge control signal, a data input signal, a first program control signal, a second program control signal, a first data output signal and a second data output signal, and the step of storing the lower program data comprises the steps of:

initializing an upper-bit register of each of the plurality of page buffers in response to the first read control signal;

storing input data, which are received from each of Y-gate circuits, in the upper-bit register of each of the plurality of page buffers in response to the data input signals;

initializing a lower-bit register of each of the plurality of page buffers in response to the second read control signal;

transferring the input data stored in the upper-bit register of each of the plurality of page buffers to the lower-bit register of each of the plurality of page buffers in response to the first program control signal; and sensing the input data and storing the sensed data in the lower-bit register of each of the plurality of page buffers as the lower program data in response to the third read control signal.

21. The program operation method as claimed in claim 20, wherein the step of programming or not programming the lower program data comprises the steps of:

allowing each of the plurality of page buffers to output lower verify data in response to the lower-bit data read from the MLC to be programmed;

allowing the verify data decision unit to determine a logic value of the lower verify data of each of the plurality of page buffers;

programming the lower program data into the MLC to be programmed when the logic value of the lower verify data of some at least one of the plurality of page buffers is "1";

repeatedly performing the steps of outputting the lower verify data, determining the logic value of the lower verify data and programming the lower program data until the lower verify data of the plurality of page buffers all become a logical "0"; and stopping the program operation of the lower program data into the MLC to be programmed when the logical value of the lower verify data is "0".

22. The program operation method as claimed in claim 21, wherein the step of outputting the lower verify data comprises the steps of:

allowing the lower-bit register of each of the plurality of page buffers to sense the lower-bit data read from the MLC to be programmed and to store the sensed data, in response to the third read control signal; and allowing the lower bit verify circuit of each of the plurality of page buffers to output the lower verify data in response to data stored in the lower-bit register.

23. The program operation method as claimed in claim 20, wherein the step of storing the upper program data comprises the steps of:
- initializing the upper-bit register of each of the plurality of page buffers in response to the first read control signal;
- storing additional input data, which are received from each of the Y-gate circuits, in the upper-bit register of each of the plurality of page buffers as the upper program data, in response to the data input signals;
- initializing a lower-bit register of each of the plurality of page buffers in response to the second read control signal;
- allowing the lower-bit register of each of the plurality of page buffers to sense the lower-bit data read from the MLC to be programmed and store the sensed data, in response to the third read control signal;
- transferring the additional input data stored in the upper-bit register of each of the plurality of page buffers to the lower-bit register of each of the plurality of page buffers in response to the first program control signal; and
- sensing the additional input data and storing the sensed data in the lower-bit register of each of the plurality of page buffers as additional lower program data in response to the third read control signal.

24. The program operation method as claimed in claim 23, wherein the step of programming or not programming the upper program data comprises the steps of:
- outputting first upper verify data in response to the upper program data;
- allowing a verify data decision unit to decide a logic value of the first upper verify data of each of the plurality of page buffers;
- programming the upper program data into the MLC to be programmed when the logic value of the first upper verify data of at least one of the plurality of page buffers is "1";
- allowing each of the plurality of page buffers to output second upper verify data in response to the upper-bit data read from the MLC to be programmed;
- allowing the verify data decision unit to determine a logic value of the second upper verify data of each of the plurality of page buffers;
- programming the upper program data into the MLC to be programmed when the logic value of the second upper verify data of at least one of the plurality of page buffers is "1";
- repeatedly performing the steps of programming the upper program data, outputting the second upper verify data and determining the logic value of the second upper verify data until the second upper verify data of the plurality of page buffers all become a logical "0"; and
- stopping the program operation of the upper program data into the MLC to be programmed when the logic value of the first upper verify data is "0".

25. The program operation method as claimed in claim 24, wherein the step of programming or not programming the upper program data further comprises the step of allowing each of the plurality of page buffers and the verify data decision unit to determine lower-bit data read from the MLC to be programmed, and program or not program the additional lower program data into the MLC to be programmed according to the verification result.

26. The program operation method as claimed in claim 25, wherein the step of programming or not programming the additional lower program data comprises the steps of:
- allowing each of the plurality of page buffers to output lower verify data in response to the lower-bit data read from the MLC to be programmed;
- allowing the verify data decision unit to determine a logic value of the lower verify data of each of the plurality of page buffers;
- programming the additional lower program data into the MLC to be programmed when the logic value of the lower verify data of at least one of the plurality of page buffers is "1";
- repeatedly performing the steps of outputting the lower verify data, determining the logic value of the lower verify data and programming the additional lower program data until the lower verify data of the plurality of page buffers all become a logical "0"; and
- stopping the program operation of the additional lower program data into the MLC to be programmed when the logic value of the lower verify data is "0".

27. The program operation method as claimed in claim 24, wherein in the step of outputting the first upper verify data, the upper bit verify circuit of each of the plurality of page buffers outputs the first upper verify data in response to the upper program data, and
the step of outputting the second upper verify data comprises the steps of:
- allowing the upper-bit register of each of the plurality of page buffers to sense the upper-bit data read from the MLC to be programmed and to store the sensed data, in response to the first read control signal; and
- allowing the upper bit verify circuit of each of the plurality of page buffers to output the upper verify data in response to data stored in the upper-bit register.

* * * * *